United States Patent
Garrity et al.

[19]

[11] Patent Number: 5,818,276
[45] Date of Patent: Oct. 6, 1998

[54] NON-OVERLAPPING CLOCK GENERATOR CIRCUIT AND METHOD THEREFOR

[75] Inventors: Douglas A. Garrity, Gilbert, Ariz.; Patrick L. Rakers, Schaumburg; Andrea Eberhardt, Hanover Park, both of Ill.

[73] Assignee: Motorola, Inc., Schaumburg, Ill.

[21] Appl. No.: 610,178

[22] Filed: Mar. 4, 1996

[51] Int. Cl.⁶ .................................................. H03H 11/16
[52] U.S. Cl. .......................................... 327/259; 327/172
[58] Field of Search ..................................... 327/172, 174, 327/176, 178, 254, 255, 258, 259, 238, 239, 243, 263, 264, 269, 271, 272, 284, 285, 293

[56] References Cited

U.S. PATENT DOCUMENTS

| | | | |
|---|---|---|---|
| 4,109,209 | 8/1978 | Bismarck | 327/259 |
| 4,645,947 | 2/1987 | Prak | 327/259 |
| 4,827,157 | 5/1989 | Machida et al. | 327/259 |
| 5,047,659 | 9/1991 | Ullrich | 327/259 |
| 5,341,031 | 8/1994 | Kinoshita et al. | 327/259 |
| 5,453,707 | 9/1995 | Hiratsuka et al. | 327/259 |
| 5,550,503 | 8/1996 | Garrity et al. | 327/259 |
| 5,589,793 | 12/1996 | Kassapian | 327/259 |

FOREIGN PATENT DOCUMENTS 363253715  10/1988  Japan .................................... 327/259

OTHER PUBLICATIONS

"Low–Power Low–Voltage Analog–To–Digital Conversion Techniques Using Pipelined Architectures", Electronics Research Laboratory, College of Engineering, University of California, Berkeley 94720, Memorandom No. UCB/ERL M95/23, 2 Apr. 1995.

*Primary Examiner*—Timothy P. Callahan
*Assistant Examiner*—My-Trang Nu Ton
*Attorney, Agent, or Firm*—Gary W. Hoshizaki; Sharon K. Coleman

[57] ABSTRACT

A non-inverting, inverting, delayed non-inverting, and delayed inverting non-overlapping clock signal is provided by a non-overlapping clock generator circuit (41, 61). The non-overlapping clock generator circuit (41, 61) increases time for circuit operation by minimizing delays between non-overlapping clock signals and simultaneously transitioning rising edges of clock signals. A non-overlapping clock generation circuit (41) comprises six NOR gates (43–48) and an inverter (42). Three NOR gates form a first delay line (43–45) and the remaining three NOR gates form a second delay line (46–48). The inverter (42) provides an inverted clock signal to the second delay line. A clock signal propagates through one delay line while the other delay line is non-responsive due to a feedback signal from the active delay line. Once the clock signal has propagated through the active delay line, the feedback signal changes and allows NOR gates of the remaining delay line to simultaneously provide a clock signal and a delayed clock signal.

9 Claims, 3 Drawing Sheets

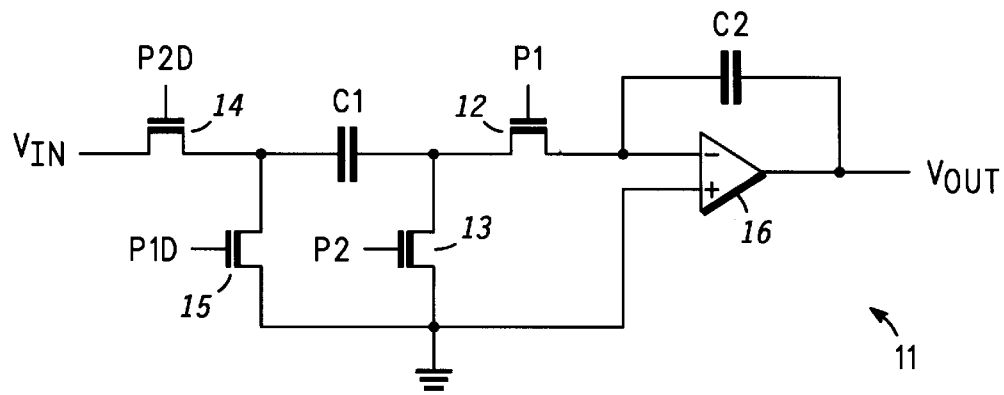
FIG. 1 —PRIOR ART—
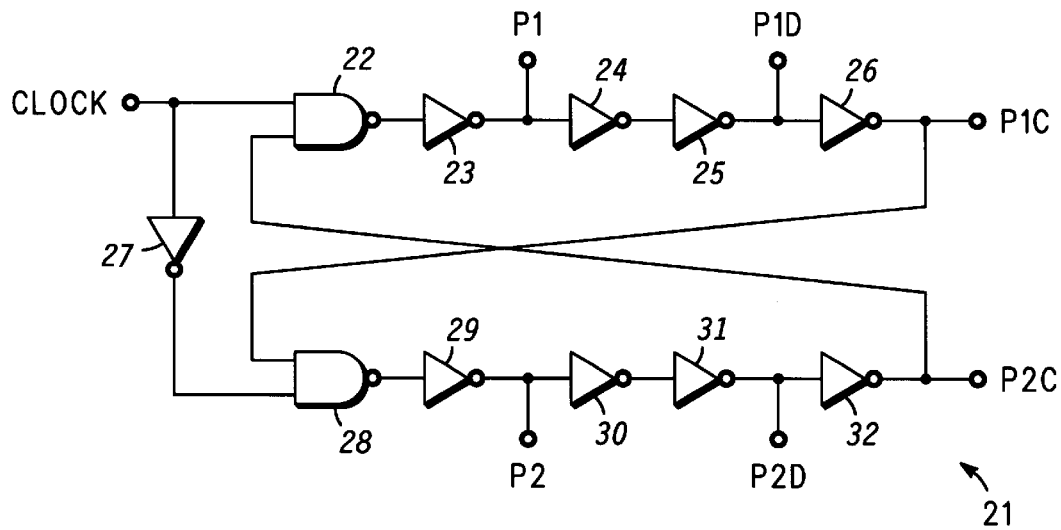
—PRIOR ART— FIG. 2
FIG. 3 —PRIOR ART—
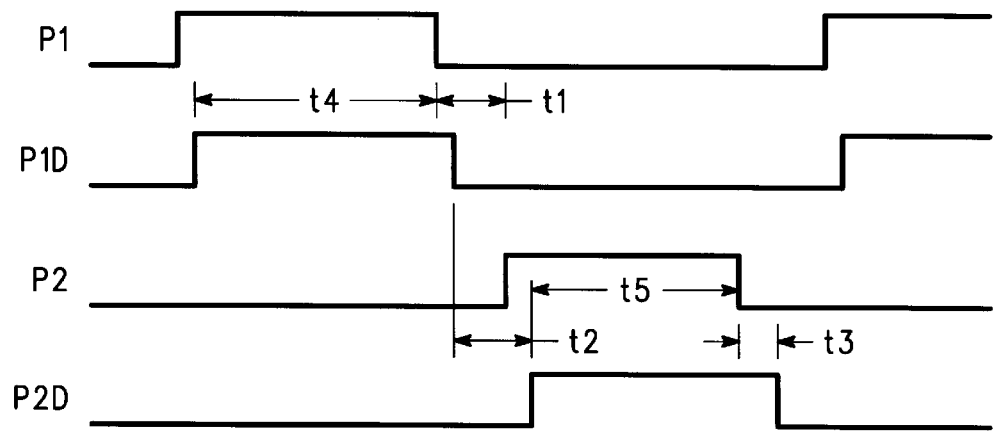

5,818,276

NON-OVERLAPPING CLOCK GENERATOR CIRCUIT AND METHOD THEREFOR

BACKGROUND OF THE INVENTION

This invention relates, in general, to clock generator circuits, and more particularly, to non-overlapping clock generation circuits.

In general, clock generation circuits are used to clock synchronous digital circuits. A clock generation circuit provides a repetitive signal having a constant period. A clock signal has a first phase and a second phase within a single period of the clock signal. Typically, a clock generation circuit provides both an inverting and non-inverting clock signal. Clock generation circuits also commonly provide delayed clock signals.

One type of clock signal is a non-overlapping clock signal. Non-overlapping clock signals are commonly used in switched capacitor circuits. A non-overlapping clock generation circuit provides a non-inverting clock signal and inverting clock signal that respectively transition before a delayed non-inverting clock signal and a delayed inverting clock signal. There is also a delay between transitions of the non-inverting clock signal and the inverting clock signal. In general, non-overlapping clock signals are used to reduce voltage error in switched capacitor circuits.

Conventional non-overlapping clock generator circuits are well known in the art and are commonly used to generate the required non-overlapping clock signals for switched capacitor circuits that process signals in the audio frequency range. However, as the signal frequencies to be processed and the associated clock frequencies increase, conventional non-overlapping clock generator circuits use an unacceptably large portion of the clock period to generate the non-overlapped clock signals and become the limiting factor in operating switched capacitor circuits at high clock frequencies.

It would be of great benefit if a non-overlapping clock generation circuit could be provided that efficiently clocks switched capacitor circuits at high clock speeds.

BRIEF DESCRIPTION OF THE DRAWINGS

FIG. 1 is a schematic diagram of a prior art switched capacitor integrator circuit;

FIG. 2 is a schematic diagram of a prior art non-overlapping clock generation circuit; and FIG. 3 is a timing diagram for the non-overlapping clock generation circuit of FIG. 2;

DETAILED DESCRIPTION OF THE DRAWINGS

Figure 4:
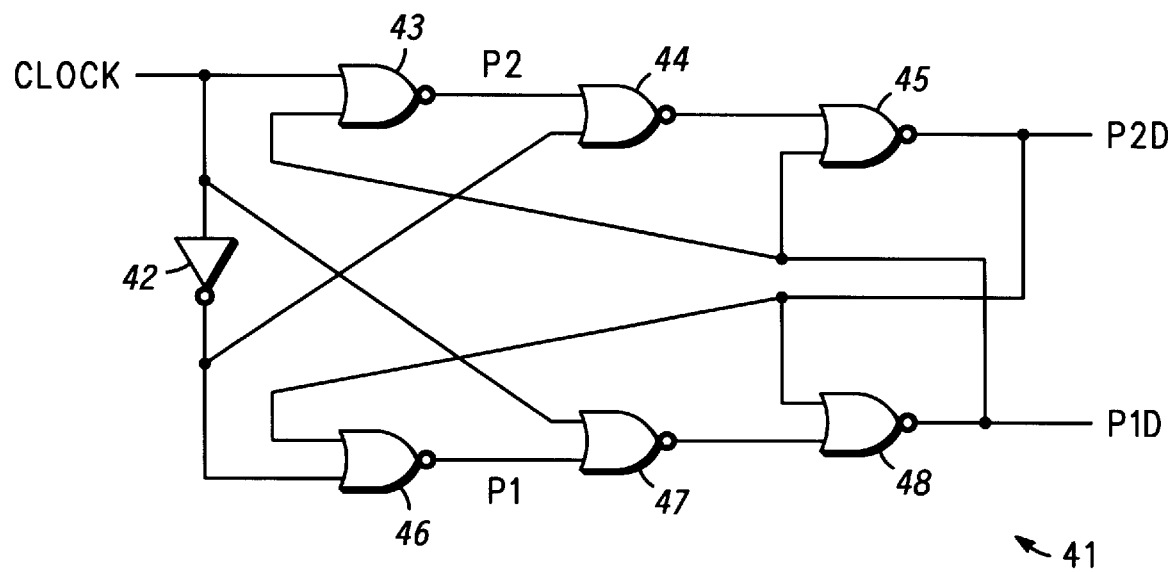
FIG. 4 is a schematic diagram of a non-overlapping clock generation circuit in accordance with the present invention.

Non-overlapping clock signals are typically used in switched capacitor circuits to minimize error. FIG. 1 is a schematic diagram of a prior art non-inverting switched capacitor integrator circuit 11 well known by one skilled in the art. Switched capacitor integrator circuit 11 comprises switches 12, 13, 14, and 15, capacitors C1 and C2, and amplifier 16. Switches 12, 13, 14, and 15 respectively receive non-overlapping clock signals P1, P2, P2D (P2-delayed), and P1D (P1-delayed).

In a first phase of operation, switches 13 and 14 are enabled to charge capacitor C1 to a voltage applied to an input Vin. Switch 14 connects the input Vin to a first terminal of capacitor C1. Switch 13 connects a second terminal of capacitor C1 to ground. Switches 12 and 15 are disabled to decouple capacitor C1 from amplifier 16 and capacitor C2.

In a second phase of operation, switches 12 and 15 are enabled to couple capacitor C1 to amplifier 16 causing the charge stored on capacitor C1 to transfer to capacitor C2. Switch 15 couples the first terminal of capacitor C1 to ground. Switch 12 couples the second terminal of capacitor C1 to an inverting input of amplifier 16. A non-inverting input of amplifier 16 is coupled to ground. Capacitor C2 is connected from an output Vout to the inverting input of amplifier 16. The transfer function of the switched capacitor integrator circuit 11 is described in equation 1.

$$Vout/Vin = (C1/C2)*(Z^{-1}/(1-Z^{-1})) \qquad (1)$$

FIG. 2 is a schematic diagram of a prior art non-overlapping clock generation circuit 21 for providing more than one non-overlapping delayed clock signal. Non-overlapping clock generation circuit 21 comprises NAND gates 22 and 28 and inverters 23, 24, 25, 26, 27, 29, 30, 31, and 32. A first delay line comprises NAND gate 22 and inverters 23–26. A second delay comprises NAND gate 28 and inverters 29–32. Clock signals P1, P1D, P2, and P2D are respectively provided at the outputs of inverters 23, 25, 29, and 31. Clock signals P1C and P2C are respectively provided at the outputs of inverters 26 and 32 and are fedback to NAND gates 22 and 28.

A CLOCK signal applied to a CLOCK input of non-overlapping clock generation circuit 21 propagates sequentially through one of the delay lines and then the remaining delay line. The delay line receiving a logic zero level from inverter 26 or inverter 32 (respectively clock signals P1C and P2C) is initially disabled from responding to a CLOCK signal transition. Alternately the NAND gate (NAND gates 22 or 28) that receives a CLOCK signal or inverted CLOCK signal that transitions from a 1-0 logic level is the first to propagate the CLOCK signal through their respective delay line.

For example, NAND gate 28 is armed for changing logic state when the CLOCK input=0, P1C=1, and P2C=0. The logic zero level of clock signal P2C (feedback signal) disables NAND gate 22 from changing logic state. As the clock signal transitions from 0-1, inverter 27 provides a 1-0 transition at the input of NAND gate 28. The clock signal propagates logic level changes through the second delay line ultimately producing a transition from 0-1 at the output of inverter 32 (P2C clock signal). Both inputs of NAND gate 22 are at a logic one level which generates a 1-0 transition at the output of NAND gate 22. The CLOCK signal now propagates through the first delay line (after the CLOCK signal has propagated through the second delay line). The sequential enabling of the two delay lines guarantees that the edges of clock signals P1, P1D, P2, and P2D are provided at different times (non-overlapping).

Conversely, NAND gate 22 is armed for changing logic state when CLOCK input=1, P1C=0, and P2C=1. The logic zero level of clock signal P1C (feedback signal) disables NAND gate 28 from changing logic state. As the CLOCK signal transitions from 1-0 a transition of 0-1 is produced at the output of NAND gate 22. The CLOCK signal propagates through the first delay line causing P1C to transition from 0-1. Both inputs of NAN gate 28 are at a logic one level which generates a 1-0 transition at the output of NAND gate 28. The CLOCK signal now propagates through the second delay line (after the CLOCK signal has propagated through the first delay line) which ultimately generates a 1-0 transition at the output of inverter 32 (clock signal P2C).

FIG. 3 is a timing diagram for the non-overlapping clock generation circuit 21 of FIG. 2. The timing diagram illustrates clock signals P1, P1D, P2, and P2D and the delay associated with the generation of each clock signal.

A delay t1 is the delay (non-overlap time between phases of clock) between transitions of the clock signals P1 and P2. The delay of t1 corresponds to the delay through inverters 24, 25, 26, 29, and NAND gate 28. A delay t2 is the delay (non-overlap time between delayed phases of clock) between transitions of the clock signals P1D and P2D. The delay corresponds to the delay through inverters 26, 29, 30, and 31, and NAND gate 28.

A delay t3 is the delay (delay time for delayed clocks) between transitions of the clock signals P1 and P1D or P2 and P2D. The delay t3 for P1 and P1D corresponds to the delay of inverters 24 and 25. Similarly, the t3 delay for P2 and P2D corresponds to the delay of inverters 30 and 31.

In general, circuit operation of a switched capacitor network occurs within a time period t4. For example, referring to FIG. 1, in one phase of operation switched capacitor integrator circuit 11 of FIG. 1 capacitor C1 is coupled to amplifier 16 during the time period t4. Switched capacitor integrator circuit 11 must transfer the charge stored on capacitor C1 to capacitor C2, and settle to a stable voltage within the time period t4 otherwise error is introduced in the system. Referring back to FIG. 3, the time period t4 does not begin until the clock signal P1D transitions. The time period t4 ends when the clock signal P1 transitions from a logic one level to a logic zero level. A similar time period t5 is also associated when the clock signal P2 is at a logic one level. In this case, a time period t5 for the second phase of the clock cycle (P2) (another phase of operation) corresponds to the time available to charge capacitor C1 of switched capacitor integrator 11.

As mentioned previously, non-overlapping clock signals are used to clock switched capacitor circuits to reduce error. Sources of error prevented by non-overlapping clock generation circuit 21 of FIG. 2 is described by example using a well known circuit such as switched capacitor integrator circuit 11 of FIG. 1. In a first case, P1D and P2D are non-overlapping. An input voltage source applying an input voltage to the input Vin of FIG. 1 would be shorted to ground if switches 14 and 15 (FIG. 1) were simultaneously enabled. Delay t2 (FIG. 3) between clock signals P1D and P2D insures that switches 14 and 15 are never on at the same time.

In a second case, P1 and P2 are non-overlapping. The summing junction of amplifier 16 (FIG. 1) would be shorted to ground which would result in a loss of feedback around amplifier 16 if clock signals P1 and P2 (FIG. 3) are enabled simultaneously. Clock signals P1 and P2 respectively enable switches 12 and 13 (FIG. 1) of switched capacitor integrator circuit 11. Delay t1 (FIG. 3) between clock signals P1 and P2 insure that switches 12 and 13 are never on at the same time.

In a third case, the falling edge of P1D and P2D respectively transitions after the falling edge of P1 and P2. Delayed signals P1D and P2D reduce charge injection errors on a switched capacitor circuit. A delayed clock scheme is used to isolate charge injection to a single switch. In other words, by turning off a single switch first (the switch being coupled to a capacitor), other switches can be prevented from injecting charge onto the capacitor. For example, switch 12 is disabled by clock signal P1 while switch 15 is disabled by clock signal P1D. Turning off switch 12 before switch 15 decouples switched capacitor integrator circuit 11 from switch 15 thereby preventing switch 15 from injecting charge when turned off by delayed clock signal P1D.

Referring to FIG. 3, a problem occurs when using a non-overlapping clock generator as shown in FIG. 2 at high clock frequencies. Delays that are purposely introduced to create non-overlapping clock signals significantly reduce the time (time period t4) in which a switched capacitor circuit has to operate. For example, assume a 20 megahertz clock signal applied to the CLOCK input of non-overlapping clock generation circuit 21 of FIG. 2. A standard 50 percent duty cycle CLOCK signal would have 25 nanoseconds for each phase of a CLOCK cycle. Time period t4, as provided by non-overlapping clock generation circuit 21, in which a switched capacitor circuit has to operate, is reduced from the provided CLOCK phase of 25 nanoseconds by approximately eight gate delays. Referring to FIG. 3, the time period t4 begins when clock signal P1D transitions and ends when clock signal P1 transitions. Referring to FIG. 2, and assuming a 1 nanosecond delay per gate for this example, there are ten gate delays (inverters 23–25, 27, 29–32, and NAND gates 22 and 28) from a rising edge of a CLOCK signal applied to the CLOCK input to a transition of clock signal P1D, so that in the present example, time period t4 begins 10 nanoseconds after the initial transition of the CLOCK input signal. Two gate delays (NAND gate 22 and inverter 23) subsequent to the next falling edge of the CLOCK input signal, clock signal P1 transitions so that time period t4 becomes the provided CLOCK signal of 25 nanoseconds minus 10 gate delays (10 nanoseconds from the CLOCK input signal rising edge to a clock signal P1D transition), plus two gate delays (2 nanoseconds from the CLOCK input signal falling edge to a clock signal P1 transition), such that t4=25 ns−10 ns+2 ns=17 ns. The reduction in the CLOCK phase due to the non-overlapping clock generation circuit of the example is eight gate delays (8 nanoseconds) or 32 percent of the CLOCK phase.

Similarly, time period t5 of FIG. 3, as provided by non-overlapping clock generation circuit 21 (FIG. 2), in which a switched capacitor circuit has to operate, is reduced from the provided CLOCK phase of 25 nanoseconds by approximately 6 gate delays. Referring to FIG. 3, the time period t5 begins when clock signal P2D transitions and ends when clock signal P2 transitions. Referring to FIG. 2, there are 9 gate delays (inverters 23–26 and 29–31, and NAND gates 22 and 28) from a falling edge of the CLOCK input signal to a transition of clock signal P2D, so that in the present example, time period t5 begins nine nanoseconds after the initial transition of the CLOCK input signal. Then three gate delays (NAND gate 22 and inverters 23 and 27) subsequent to the next rising edge of the CLOCK input signal, clock signal P2 transitions so that time period t5 becomes the provided CLOCK phase of 25 nanoseconds minus nine gate delays (nine nanoseconds from a CLOCK input signal falling edge to a clock signal P2 transition) which gives time period t5=25 ns−9 ns+3 ns=19 ns, which is a reduction of six gate delays (6 nanoseconds) or 24 percent of the CLOCK phase. Reducing the time period for a phase of a CLOCK signal limits the time period in which an operation of a circuit is performed. Using FIG. 1 as an example, this would correspond to operations such as charging capacitor C1 of switched capacitor integrator circuit 11 or transferring a charge stored on capacitor C1.

FIG. 4 is a schematic diagram of a non-overlapping clock generation circuit 41 in accordance with the present invention. Non-overlapping clock generation circuit 41 increases the time periods t4 and t5 of FIG. 3 to maximize operation time of a circuit requiring non-overlapping clock signals. Non-overlapping clock generation circuit 41 comprises an inverter 42, and NOR gates 43, 44, 45, 46, 47, and 48. A CLOCK signal is applied to a CLOCK input of non-overlapping clock generation circuit 41. Inverter 42 provides an inverting CLOCK signal. Inverter 42 is shown for completeness whereas non-inverting and inverting CLOCK signals could be provided to non-overlapping clock generation circuit 41 thereby eliminating the need for inverter 42. Non-overlapping clock generation circuit 41 includes outputs P1, P2, P1D, and P2D for providing clock signals P1, P2, P1D, and P2D.

The requirements for non-overlapping clock signals as addressed in the three cases described in FIG. 3 are also provided by non-overlapping clock generation circuit 41. In particular, a delay between P1 and P2 (t1 of FIG. 3), a delay between P1D and P2D (t2 of FIG. 3), and a delay between P1 and P1D (t3), and P2 and P2D (t3) are generated by non-overlapping clock generation circuit 41. The method implemented to reduce delay and increase a time period for each clock phase (t4 and t5 of FIG. 3) includes simultaneously transitioning clock signals corresponding to P1 and P1D during one phase of a CLOCK cycle and simultaneously transitioning clock signals corresponding to P2 and P2D during another phase of a CLOCK cycle. Providing these signals simultaneously does not violate the three cases mentioned hereinabove but eliminates the delay between the clock signals as generated by the prior art non-overlapping clock generation circuit 21 of FIG. 2 which decreases time periods t4 and t5 of FIG. 3. Furthermore, non-overlapping clock generation circuit 41 minimizes the logic delays through the circuit to maximize time periods t4 and t5.

Non-overlapping clock generation circuit 41 includes a first delay line comprising NOR gates 43, 44, and 45 and a second delay line comprising NOR gates 46, 47, and 48. A feedback signal is applied to two points in each delay line. Clock signal P1D is fed back to NOR gates 43 and 45. Similarly, clock signal P2D is fed back to NOR gates 46 and 48. Inverter 42 has an input connected to the CLOCK input and an output. NOR gate 43 has a first input connected to the CLOCK input, a second input connected to the P1D output, and an output connected to the P2 output. NOR gate 44 has a first input connected to the P2 output, a second input connected to the output of inverter 42, and an output. NOR gate 45 has a first input connected to the output of NOR gate 44, a second input connected to the P1D output, and an output connected to the P2D output.

NOR gate 46 has a first input connected to the P2D output, a second input connected to the output of inverter 42, and an output connected to the P1 output. NOR gate 47 has a first input connected to the CLOCK input, a second input connected to the P1 output, and an output. NOR gate 48 has a first input connected to the P2D output, a second input connected to the output of NOR gate 47, and an output connected to the P1D output.

Figure 5:
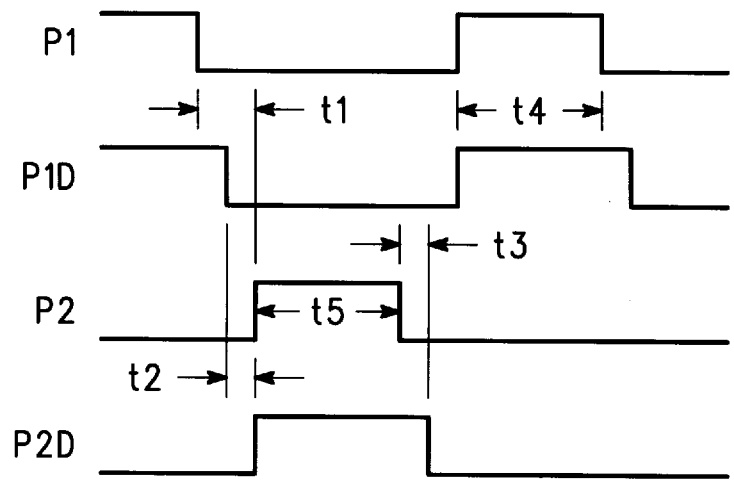
FIG. 5 is a timing diagram for the non-overlapping clock generation circuit of FIG. 4.

FIG. 5 is a timing diagram for non-overlapping clock generation circuit 41 of FIG. 4. Operation of non-overlapping clock generation circuit 41 and the delays associated thereto are described using the timing diagram. Initial conditions for the timing diagram have P1 and P1D at a logic one level, and P2 and P2D at a logic zero level. A CLOCK signal (not shown) applied to the CLOCK input of non-overlapping clock generation circuit 41 transitions from 1-0 (begins a first phase of the CLOCK cycle) producing a first logic level change in the timing diagram.

The logic one level at P1D applied to the second inputs of NOR gates 43 and 45 (FIG. 4) holds outputs P2 and P2D at logic zero levels until P1D transitions to a logic zero level. The 1-0 transition of the clock signal at the CLOCK input is inverted by inverter 42 (FIG. 4) which generates a 1-0 transition at the output of NOR gate 46 (FIG. 4) (P1 output, FIG. 4). The CLOCK signal propagates serially through the second delay line, ultimately producing a 1-0 transition of the cock signal at the output of NOR gate 48 (P1D output). In particular, a 1-0 transition is generated at the output of NOR gate 46 (clock signal P1), a 0-1 transition at the output of NOR gate 47, and a 1-0 transition at the output of NOR gate 48 (clock signal P1D). The delay between the transitioning edges of the CLOCK signal and output P1D is four gate delays (inverter 42 and NOR gate 46, 47, and 48).

Prior to output P1D transitioning from a 1-0, the output of inverter 42 transitioning from a 0-1 produces a 1-0 transition at the output of NOR gate 44. The output of NOR gate 48 (output P1D) transitioning from 1-0 enables NOR gates 43 and 45 to change logic state. Both inputs of NOR gates 43 and 45 are at a logic zero level once the P1D output transitions from 1-0. NOR gates 43 and 45 generate a 0-1 transition simultaneously. The simultaneous 0-1 transition of P2 and P2D is shown in FIG. 5 which reduces delay through non-overlapping clock generation circuit 41. The time delay to generate the logic change in P2 and P2D is a single gate delay (NOR gate 43 or 45).

The time delay t1 between clock signals P1 and P2 corresponds to the total gate delays of NOR gates 47, 48, and 43 (3 gate delays). The delay t1 is substantially reduced (3 gate delay) than the 5 gate delay (inverters 24, 25, 26, 29, and NAND gate 28 of FIG. 2) produced by prior art non-overlapping clock generation circuit 21 of FIG. 2.

The time delay t2 between clock signals P1D and P2D corresponds to the gate delay of NOR gate 45 (1 gate delay). The time delay t2 is substantially reduced (1 gate delay) from the 5 gate delay (inverters 26, 29, 30, and 31, and NAND gate 28 of FIG. 2) produced by prior art non-overlapping clock generation circuit 21. The resultant reduction in delay between clock signals increases the operation time available for a circuit corresponding to time period t5 for clock signals P2.

The time delay t3 between clock signals P1 and P1D corresponds to the gate delays of NOR gates 47 and 48. The time delay t3 (two gates) is approximately equal to the delay produced by non-overlapping clock generation circuit 21 of FIG. 2 (inverters 24 and 25).

Prior to the end of the time period t5 for the clock signal P2, the CLOCK signal at the clock input transitions from a 0-1 (begins the second phase of the CLOCK cycle) producing a second logic level change in the timing diagram. NOR gates 46 and 48 are disabled from changing logic state while clock signal P2D is at a one logic level. The 0-1 transition of the CLOCK signal serially propagates through the first delay line. In particular, a 1-0 transition is generated at the output of NOR gate 43 (clock signal P2), a 0-1 transition at the output of NOR gate 44, and a 1-0 transition at the output of NOR gate 45 (clock signal P2D). The delay between the transitioning edges of the CLOCK signal and the output P2D is three gate delays (NOR gate 43, 44, and 45).

The CLOCK signal (logic one level) coupled to the first input of NOR gate 47 generates a 1-0 transition at the output of NOR gate 47. The output of NOR gate 45 (output P2D) transitioning from 1-0 enables NOR gates 46 and 48 to change logic state. Both inputs of NOR gates 46 and 48 are at a logic zero level once the P1D output transitions from 1-0. NOR gates 46 and 48 generate a 0-1 transition simultaneously. The simultaneous 0-1 transition of P1 and P1D is shown in FIG. 5 which reduces delay through non-overlapping clock generation circuit 41. The time delay to generate the logic change in P1 and P1D is a single gate delay (NOR gate 46 or 48).

The time delay t1 between clock signals P2 and P1 corresponds to the total gate delays of NOR gates 44, 45, and 46 (3 gate delays). The time delay t2 between clock signals P2D and P1D corresponds to the gate delay of NOR gate 48 (1 gate delay). The time delay t3 between the clock signals P2 and P2D corresponds to the gate delays of NOR gates 44 and 45. The resultant reduction in delay between clock signals increases the operation time available for a circuit corresponding to time period t4 for clock signals P1.

An example, similar to that described for non-overlapping clock generation circuit of FIG. 2 illustrates how overall delay is reduced which significantly increases the time periods t4 and t5. A 20 megahertz CLOCK input signal is applied to the CLOCK input of non-overlapping clock generation circuit 41 of FIG. 4. A standard 50 percent duty cycle CLOCK input signal would have 25 nanoseconds for each phase of a CLOCK cycle. Time period t4, as provided by non-overlapping clock generation circuit 41, in which a switched capacitor circuit has to operate, is reduced from the provided CLOCK phase of 25 ns by approximately two gate delays. Referring to FIG. 5, the time period t4 begins when clock signal P1D transitions and ends when clock signal P1 transitions. Referring to FIG. 4, and assuming a one nanosecond delay for each gate delay in this example, there are four gate delays (NOR gates 43–45, and 48) from a rising edge (i.e. a transition from a logic zero to a logic one) of the CLOCK input signal to a transition of clock signal P1D, so that in the present example, time period t4 begins four nanoseconds after the initial transition of the clock input signal from a logic zero to a logic one. Two gate delays (inverter 42 and NOR gate 46) subsequent to the next falling edge (i.e. a transition from a logic one to a logic zero) of the CLOCK input signal, clock signal P1 transitions so that time period t4 becomes the provided CLOCK phase of 25 nanoseconds minus four gate delays (four nanoseconds from the clock input signal rising edge to a clock signal P1D transition), therefore time period t4=25 ns−4 ns+2 ns=23 ns. Thus, the total reduction in the CLOCK phase is two gate delays or eight percent of the CLOCK phase.

Similarly, time period t5, as provided by non-overlapping clock generation circuit 41, in which a switched capacitor circuit has to operate, is reduced from the provided CLOCK phase of 25 nanoseconds by approximately four gate delays. Referring to FIG. 5, the time period t5 begins when clock signal P2D transitions and ends when clock signal P2 transitions. Referring to FIG. 4, there are five gate delays (inverter 42, and NOR gates 45–48) from a falling edge of the CLOCK input signal to a transition of clock signal P2D, so that in the present example, t5 begins five nanoseconds after the initial transition of the CLOCK input signal. One gate delay (NOR gate 43) subsequent to the next rising edge of the CLOCK input signal, clock signal P2 transitions so that time period t5 becomes the provided clock phase minus five gate delays (five nanoseconds from the CLOCK input signal from a logic one to a logic zero falling edge to the clock signal P2D transition), plus one gate delay (one nanosecond from a CLOCK input signal rising edge to a clock signal P2D transition), therefore time period t5=25 ns−5 ns+1 ns=21 ns, which is a reduction of four gate delays (four nanoseconds) or 16 percent of the CLOCK phase. The reductions in t4 and t5 obtained with non-overlapping clock generation circuit 41 of only 8 and 16 percent respectively, is significantly reduced from non-overlapping clock generation circuit 21 (FIG. 2) which had a reduction in t4 and t5 of respectively 32 and 24 percent in the example given hereinabove.

Figure 6:
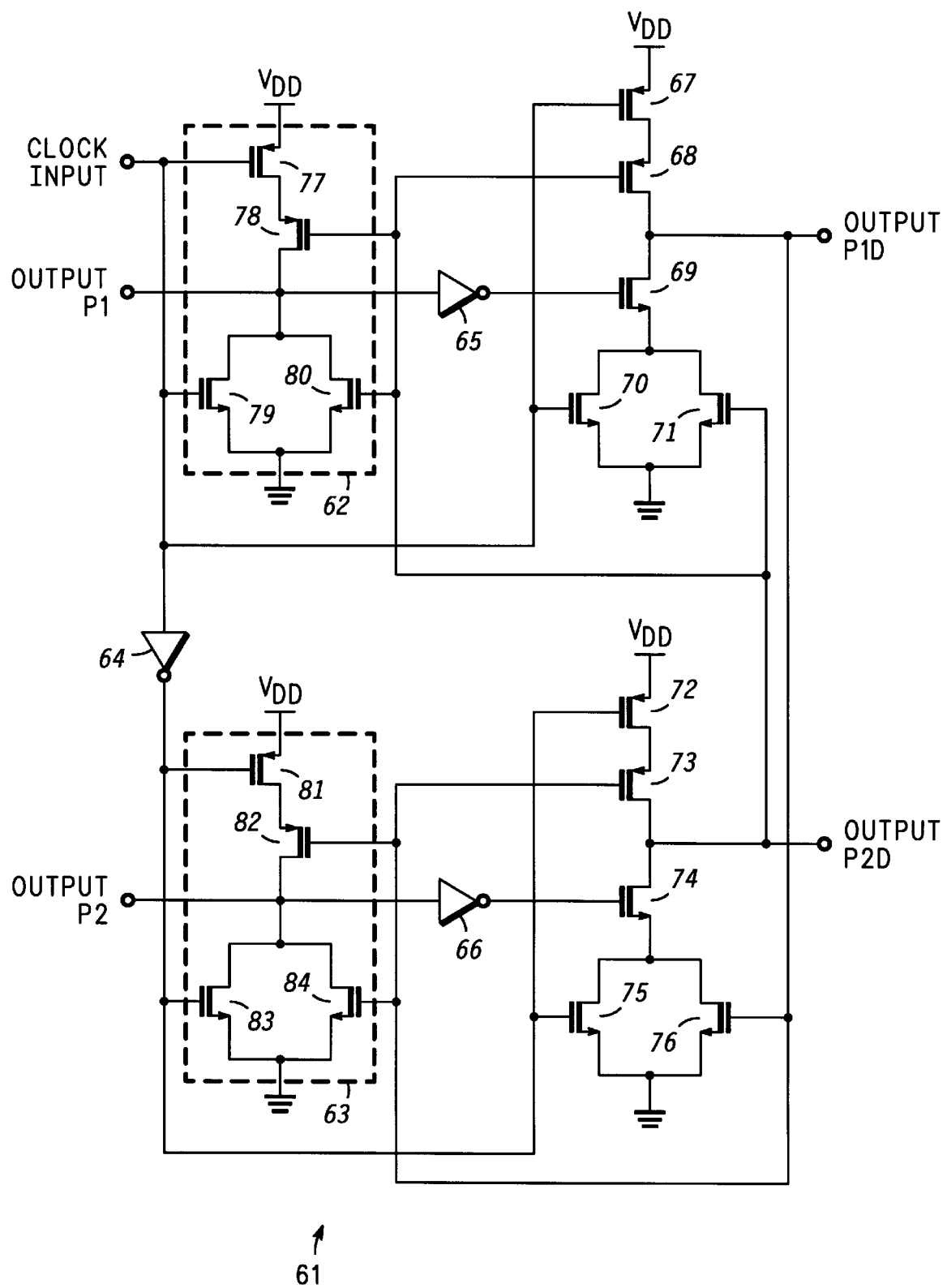
FIG. 6 is a schematic diagram of a non-overlapping clock generation circuit in accordance with the present invention.

FIG. 6 is a schematic diagram of a non-overlapping clock generation circuit 61 in accordance with the present invention. FIG. 6 is an alternate embodiment that produces similar results to non-overlapping clock generation circuit 41 of FIG. 4. The timing diagram of FIG. 5 also corresponds to the operation of non-overlapping clock generation circuit 61.

Non-overlapping clock generation circuit 61 comprises NOR gates 62 and 63, inverters 64, 65, and 66, a first logic circuit, and a second logic circuit. Non-overlapping clock generation circuit 61 includes a CLOCK input and outputs P1, P1D, P2, and P2D. Outputs P1, P1D, P2, and P2D respectively provide clock signals P1, P1D, P2, and P2D as shown in timing diagram of FIG. 5. The first logic circuit comprises transistors 67, 68, 69, 70, and 71. The second logic circuit comprises transistors 72, 73, 74, 75, and 76.

Transistors 67, 68, 72, 73, 77, 78, 81, and 82 are p-channel enhancement Metal Oxide Semiconductor Field Effect Transistors (MOSFETs) having a drain, gate, and source respectively corresponding to a first electrode, a control electrode, and a second electrode. Transistors 69, 70, 71, 74, 75, 76, 79, 80, 83, and 84 are n-channel enhancement MOSFETs having a drain, gate, and source respectively corresponding to a first electrode, a control electrode, and a second electrode.

NOR gate 62 generates the clock signal P1. NOR gate 62 is a two input NOR gate having a first input connected to the CLOCK input, a second input connected to the P2D output, and an output connected to the P1 output. NOR gate 62 comprises transistors 77, 78, 79, and 80. Transistor 77 has a drain, a gate connected to the CLOCK input, and a source connected to a first power supply terminal (e.g. VDD). Transistor 78 has a drain connected to the output P1, a gate connected to the output P2D, and a source connected to the drain of transistor 77. Transistor 79 has a drain connected to the output P1, a gate connected to the CLOCK input, and a source connected to a second power supply terminal (e.g. ground). Transistor 80 has a drain connected to the output P1, a gate connected to the P2D output, and a source connected to ground.

Inverter 65 inverts the clock signal P1. Inverter 65 has an input connected to the output P1 and an output. The first logic circuit comprises transistors 67–71 and generates the clock signal P1D. Transistor 67 has a drain, a gate connected to the CLOCK input, and a source connected to VDD. Transistor 73 has a drain connected to the output P1D, a gate connected to the output P2D, and a source connected to the drain of transistor 67. Transistor 69 has a drain connected to the output P1D, a gate connected to the output of inverter 65, and a source. Transistor 70 has a drain connected to the source of transistor 69, a gate connected to the CLOCK input, and a source connected to ground. Transistor 71 has a drain connected to the source of transistor 69, a gate connected to the output of P2D, and a source connected to ground.

Inverter 64 inverts a CLOCK signal applied to the CLOCK input. Inverter 64 has an input connected to the CLOCK input and an output. NOR gate 63 generates the clock signal P2. NOR gate 63 is a two input NOR gate having a first input connected to the output of inverter 64, a second input connected to the P1D output, and an output connected to the P2 output. NOR gate 63 comprises transistors 81, 82, 83, and 84. Transistor 81 has a drain, a gate connected to the output of inverter 64, and a source connected to VDD. Transistor 82 has a drain connected to the output P2, a gate connected to the output P1D, and a source connected to the drain of transistor 81. Transistor 83 has a drain connected to the output P2, a gate connected to the output of inverter 64, and a source connected to ground. Transistor 84 has a drain connected to the output P2, a gate connected to the P1D output, and a source connected to ground.

Inverter 66 inverts the clock signal P2. Inverter 66 has an input connected to the output P2 and an output. The second logic circuit comprises transistors 72–76 and generates the clock signal P2D. Transistor 72 has a drain, a gate connected to the output of inverter 64, and a source connected to VDD. Transistor 68 has a drain connected to the output P2D, a gate connected to the output P1D, and a source connected to the drain of transistor 72. Transistor 74 has a drain connected to the output P2D, a gate connected to the output of inverter 66, and a source. Transistor 75 has a drain connected to the source of transistor 74, a gate connected to the output of inverter 64, and a source connected to ground. Transistor 76 has a drain connected to the source of transistor 74, a gate connected to the output of P1D, and a source connected to ground.

NOR gates 62 and 63, the first logic circuit, and the second logic circuit each have serially connected transistors as shown in the schematic diagram. Although shown in a specific configuration, no order for the series connected devices are implied.

A description of the operation of non-overlapping clock generation circuit 61 utilizes the timing diagram of FIG. 5. Initially, clock signals P1 and P1D are at a logic one level and clock signals P2 and P2D are at a logic zero level. Clock signal P1D (logic one level) holds the output of NOR gate 63 at a logic zero level. The logic one level provided by inverter 66 and clock signal P1D combine to hold the output of the second logic circuit at a logic zero level (output P2D). A CLOCK signal (not shown) provided to the CLOCK input transitioning from a 0-1 produces the first change in logic state of clock generation circuit 61.

The 0-1 transition (a first phase of the CLOCK cycle) of the CLOCK signal produces the following sequential events. First, the 0-1 transition of the CLOCK signal produces a 1-0 transition at the output of NOR gate 62 (output P1). Second, transistors 70 and 69 of the first logic circuit are respectively enabled by the CLOCK signal and inverter 65 which generates a 1-0 transition at the output P1D. Note that transistor 67 of the first logic circuit is disabled by the CLOCK signal. Third, NOR gate 63 and the second logic circuit simultaneously generate a 0-1 transition at their respective outputs (outputs P2 and P2D, respectively). Transistors 81 and 82 of NOR gate 63 are respectively enabled by the output of inverter 64 (1-0) and the second logic circuit (1-0 transition at output P1D) for generating a 0-1 transition at the output of NOR gate 63 (output P2). Similarly, transistors 72 and 73 of the second logic circuit are respectively enabled by the output of inverter 64 (1-0) and the first logic circuit (1-0 transition at output P1D) for generating a 0-1 transition at the output of the first logic circuit (output P2D).

The time delay t1 between the P1 and P2 clock signals corresponds to the delay of inverter 65, the first logic circuit, and NOR gate 63 (three gate delays). The time delay t2 between the P1D and P2D clock signals corresponds to the delay of the second logic circuit (one gate delay). The time delay t3 between the P1 and P1D clock signals corresponds to the delay of inverter 65 and, the first logic circuit (2 gate delays).

Prior to the end of the time period t5 which is the time available for circuit operation in the P2 or burst phase of the CLOCK cycle, the CLOCK signal at the clock input transitions from a 1-0. Clock signals P1=P1D=0 and P2=P2D=1 prior to the CLOCK signal changing state. The 1-0 (beginning a second phase of the CLOCK cycle) transition of the CLOCK signal produces the following sequential events. First, the 1-0 transition of the CLOCK signal is inverted by inverter 64 (0-1 transition) which generates a 1-0 transition at the output of NOR gate 62 (output P1). Second, transistors 75 and 74 of the second logic circuit are respectively enabled by the output of inverter 64 (0-1 transition) and inverter 66 (0-1 transition) which produces 1-0 transition at the output P2D. Note that transistor 72 is disabled by the output of inverter 64 (logic one level). Third, NOR gate 62 and the first logic circuit simultaneously generate a 0-1 transition at their respective outputs (outputs P1 and P1D, respectively). Transistors 77 and 78 of NOR gate 62 are respectively enabled by the CLOCK signal (1-0) and the second logic circuit (1-0 transition at output P2D) for generating a 0-1 transition at the output of NOR gate 62 (output P1). Similarly, transistors 67 and 68 of the first logic circuit are respectively enabled by the CLOCK signal (1-0) and the second logic circuit (1-0 transition at output P2D) for generating a 0-1 transition at the output of the first logic circuit (output P1D).

The time delay t1 between the P2 and P1 clock signals corresponds to the delay of inverter 66, the second logic circuit, and NOR gate 62 (three gate delays). The time delay t2 between the P2D and P1D clock signals corresponds to the delay of the first logic circuit (one gate delay). The time delay t3 between the P2 and P2D clock signals corresponds to the delay of inverter 66 and the second logic circuit (2 gate delays).

Simulation results of both embodiments as shown in FIG. 4 and FIG. 6 have similar delay times. Transistors 79 and 83 of NOR gates 62 and 63 have primary responsibility for generating a logic zero level. Transistors 80 and 84 hold the logic zero level to prevent a CLOCK signal from propagating through a delay line. Thus, transistors 80 and 84 can be made smaller than transistors 79 and 83 to reduce area and capacitance. Similarly, transistors 70 and 75 of the first and second logic circuit have primary responsibility for generating a logic zero level. Transistors 71 and 76 hold the logic zero level. Thus, transistors 71 and 76 can be made smaller than transistors 70 and 75. This technique can also be applied to non-overlapping clock generation circuit 41 of FIG. 4.

By now it should be appreciated that a non-overlapping clock generation circuit has been provided that substantially increases the operation time period of each clock phase generated. Delay is reduced by simultaneously transitioning clock signals that do not require delay therebetween. Furthermore, delay is minimized by reducing the number of logic elements in the non-overlapping clock generation circuit.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A non-overlapping clock generation circuit comprising:
   an inverter having an input coupled to a clock input of the non-overlapping clock generation circuit and an output;
   a first NOR gate having a first input coupled to said clock input of the non-overlapping clock generation circuit, a second input, and an output;

a second NOR gate having a first input coupled to said output of said first NOR gate, a second input coupled to said output of said inverter, and an output;

a third NOR gate having a first input coupled to said output of said second NOR gate, a second input, and an output;

a fourth NOR gate having a first input coupled to said output of said third NOR gate, a second input coupled to said output of said inverter, and an output;

a fifth NOR gate having a first input coupled to said clock input of the non-overlapping clock generation circuit, a second input coupled to said output of said fourth NOR gate, and an output; and a sixth NOR gate having a first input coupled to said output of said third NOR gate, a second input coupled to said output of said fifth NOR gate, and an output coupled to said second inputs of said first and third NOR gates.

2. A non-overlapping clock generation circuit having a clock input, a first clock output, a second clock output, a third clock output, and a fourth clock output comprising:

a first inverter having a first input coupled to the clock input and an output;

a first NOR gate having a first input coupled to the clock input, a second input coupled to the fourth clock output, and an output coupled to the first clock output;

a second NOR gate having a first input coupled to said output of said first inverter, a second input coupled to the second clock output, and an output coupled to the third clock output;

a second inverter having an input coupled to the first clock output and an output;

a third inverter having an input coupled to the third clock output and an output;

a first transistor of a first conductivity type having a first electrode, a control electrode coupled to the clock input, and a second electrode coupled to a first power supply terminal;

a second transistor of said first conductivity type having a first electrode coupled to the second clock output, a control electrode coupled to the fourth clock output, and a second electrode coupled to said first electrode of said first transistor;

a third transistor of a second conductivity type having a first electrode coupled to the second clock output, a control electrode coupled to said output of said second inverter, and a second electrode;

a fourth transistor of said second conductivity type having a first electrode coupled to said second electrode of said third transistor, a control electrode coupled to the clock input, and a second electrode coupled to a second power supply terminal;

a fifth transistor of said second conductivity type having a first electrode coupled to said second electrode of said third transistor, a control electrode coupled to the fourth clock output, and a second electrode coupled to said second power supply terminal;

a sixth transistor of said first conductivity type having a first electrode, a control electrode coupled to said output of said first inverter, and a second electrode coupled to said first power supply terminal;

a seventh transistor of said first conductivity type having a first electrode coupled to the fourth clock output, a control electrode coupled to the second clock output, and a second electrode coupled to said first electrode of said sixth transistor;

an eighth transistor of said second conductivity type having a first electrode coupled to the fourth clock output, a control electrode coupled to said output of said third inverter, and a second electrode;

a ninth transistor of said second conductivity type having a first electrode coupled to said second electrode of said eighth transistor, a control electrode coupled to said output of said first inverter, and a second electrode coupled to said second power supply terminal; and a tenth transistor of said second conductivity type having a first electrode coupled to said second electrode of said eighth transistor, a control electrode coupled to the second clock output, and a second electrode coupled to said second power supply terminal.

3. The non-overlapping clock generation circuit as recited in claim 2 wherein said fifth transistor has a conductivity area smaller than said fourth transistor.

4. The non-overlapping clock generation circuit as recited in claim 2 wherein said tenth transistor has a conductivity area smaller than said ninth transistor.

5. The non-overlapping clock generation circuit as recited in claim 2 wherein said first NOR gate comprises:

a first transistor of said first conductivity type having a first electrode, a control electrode coupled to the clock input, and a second electrode coupled to said first power supply terminal;

a second transistor of said first conductivity type having a first electrode coupled to the first clock output, a control electrode coupled to the fourth clock output, and a second electrode coupled to said first electrode of said first transistor;

a third transistor of said second conductivity type having a first electrode coupled to the first clock output, a control electrode coupled to the clock input, and a second electrode coupled to said second power supply terminal; and a fourth transistor of said second conductivity type having a first electrode coupled to the first clock output, a control electrode coupled to the fourth clock output, and a second electrode coupled to said second power supply terminal.

6. The non-overlapping clock generation circuit as recited in claim 5 wherein said fourth transistor has a conductivity area smaller than said third transistor.

7. The non-overlapping clock generation circuit as recited in claim 2 wherein said second NOR gate comprises:

a first transistor of said first conductivity type having a first electrode, a control electrode coupled to said output of said first inverter, and a second electrode coupled to said first power supply terminal;

a second transistor of said first conductivity type having a first electrode coupled to the third clock output, a control electrode coupled to the second clock output, and a second electrode coupled to said first electrode of said first transistor;

a third transistor of said second conductivity type having a first electrode coupled to the third clock output, a control electrode coupled to said output of said first inverter, and a second electrode coupled to said second power supply terminal; and a fourth transistor of said second conductivity type having a first electrode coupled to the third clock output, a control electrode coupled to the second clock output, and a second electrode coupled to said second power supply terminal.

8. The non-overlapping clock generation circuit as recited in claim 7 wherein said fourth transistor has a conductivity area smaller than said third transistor.

9. A method for reducing delay in a non-overlapping clock generation circuit, the non-overlapping clock generation circuit providing a first clock signal, a second clock signal, a third clock signal, and a fourth clock signal in response to an input clock signal, the method comprising the steps of:

simultaneously transitioning said first and second clock signals from a first logic state to a second logic state in a first phase of a cycle of the input clock signal;

delaying a transition of said second clock signal from said second logic state to said first logic state relative to a transition of said first clock signal from said second logic state to said first logic state in a second phase of said cycle;

simultaneously transitioning said third and fourth clock signals in said second phase of said cycle; and delaying a transition of said fourth clock signal relative to a transition of said third clock signal in said first phase of said cycle.

* * * * *